(12) United States Patent
Yang (10) Patent No.: US 7,435,631 B2
(45) Date of Patent: Oct. 14, 2008

(54) LIQUID CRYSTAL DISPLAY DEVICE AND METHOD OF MANUFACTURING THE SAME

(75) Inventor: JoonYoung Yang, Buchon-Si (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 11/321,585

(22) Filed: Dec. 29, 2005

(65) Prior Publication Data

US 2006/0145162 A1 Jul. 6, 2006

(30) Foreign Application Priority Data

Dec. 31, 2004 (KR) .................. 10-2004-0118378

(51) Int. Cl.
*H01L 21/00* (2006.01)
*H01L 21/84* (2006.01)

(52) U.S. Cl. .................. 438/149; 438/151; 438/164

(58) Field of Classification Search ........... 438/149, 438/151, 164, 166; 257/E21.411, 59, 72, 257/347
See application file for complete search history.

(56) References Cited

U.S. PATENT DOCUMENTS 6,617,203 B2 * 9/2003 Kim et al. ............... 438/149

* cited by examiner

*Primary Examiner*—Thien F Tran
(74) *Attorney, Agent, or Firm*—Brinks Hofer Gilson & Lione (57) ABSTRACT

An LCD and a method of manufacturing the same using at most six mask processes are provided. An active layer and a storage electrode are simultaneously formed by diffraction exposure. Multiple ion implantations are performed using a photoresist or the gate electrode to mask different areas of an underlying semiconductor. Source and drain electrodes and a pixel electrode are simultaneously formed by diffraction exposure. First and second connection electrodes that lower the contact resistance between the drain electrode and the active layer are formed by a lift-off process.

11 Claims, 11 Drawing Sheets

LIQUID CRYSTAL DISPLAY DEVICE AND METHOD OF MANUFACTURING THE SAME

TECHNICAL FIELD

The present invention relates to a liquid crystal display device (LCD), and more particularly, to an LCD and a method of manufacturing the same, which can simplify the manufacturing process and reduce the manufacturing cost.

DESCRIPTION OF THE RELATED ART

An LCD is considered as the next generation display device because it has good portability and low power consumption and is also technology-intensive and high value-added. The LCD is a non-luminous device in which liquid crystal is injected between a color filter substrate and an array substrate including a thin film transistor (TFT), and an image is displayed by using the anisotropy of the liquid crystal and the different refractivity of light.

An active matrix (AM) LCD is mainly used among the LCDs. In the AMLCD, one TFT serves as a switching device that adjusts the liquid crystal in one pixel to change the transmittance of the pixel.

This TFT is generally formed of amorphous silicon (a-Si). The a-Si TFT can be easily manufactured in a large area using a low-priced insulating layer that can be deposited at a low temperature of 350° C. or less.

However, the amorphous silicon has a disordered atomic arrangement and thus has a weak Si—Si bond and a dangling bond. Accordingly, when light or an electric field is applied thereto, the amorphous silicon is changed into a quasi-stable state and is thus unstable for use as the TFT. Specifically, the amorphous silicon is degraded by light irradiation, and is difficult to use for a driving circuit due to its low electric field mobility (0.1-1.0 $cm^2/V \cdot s$) and low reliability. Also, since an insulating substrate and a printed circuit board (PCB) are connected by a tape carrier package (TCP) driving IC for the a-Si TFT substrate, its installation cost and the cost of the driving IC occupies a large part of the manufacturing cost. Furthermore, when the resolution of the LCD increases, it is difficult to perform a TCP bonding process because a pad pitch for connecting the gate and data lines of the TFT substrate to the TCP becomes shorter.

Meanwhile, polysilicon has higher electric field mobility than the amorphous silicon. Accordingly, polysilicon can be used for directly mounting the driving circuit on the substrate. In this case, the cost for the driving IC can be reduced and the driving circuit can be simply mounted. Also, polysilicon can be conveniently used for a switching device of the high-resolution panel. In addition, polysilicon can be applied to a display device that is highly irradiated because it has a smaller photocurrent than the amorphous silicon.

Figure 1:
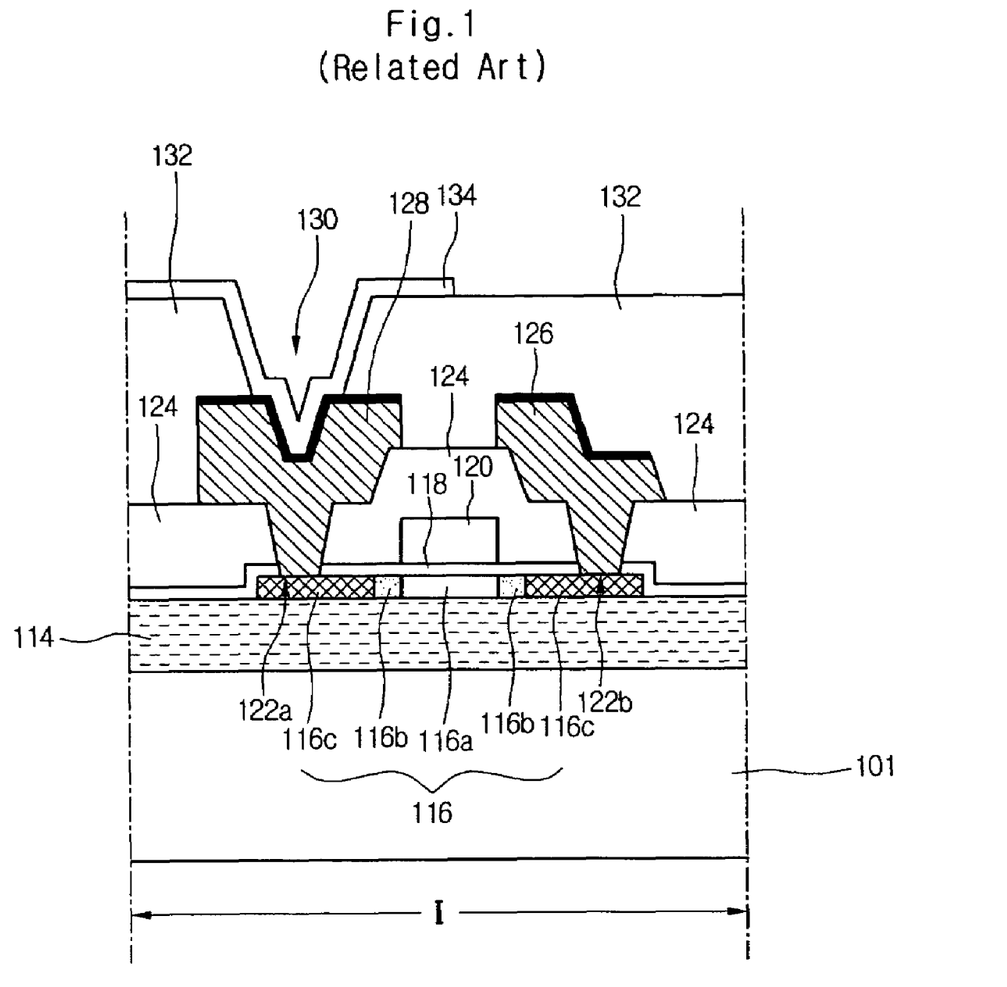
FIG. 1 is a sectional view of a TFT of a pixel unit in the related art LCD.
Figure 2:
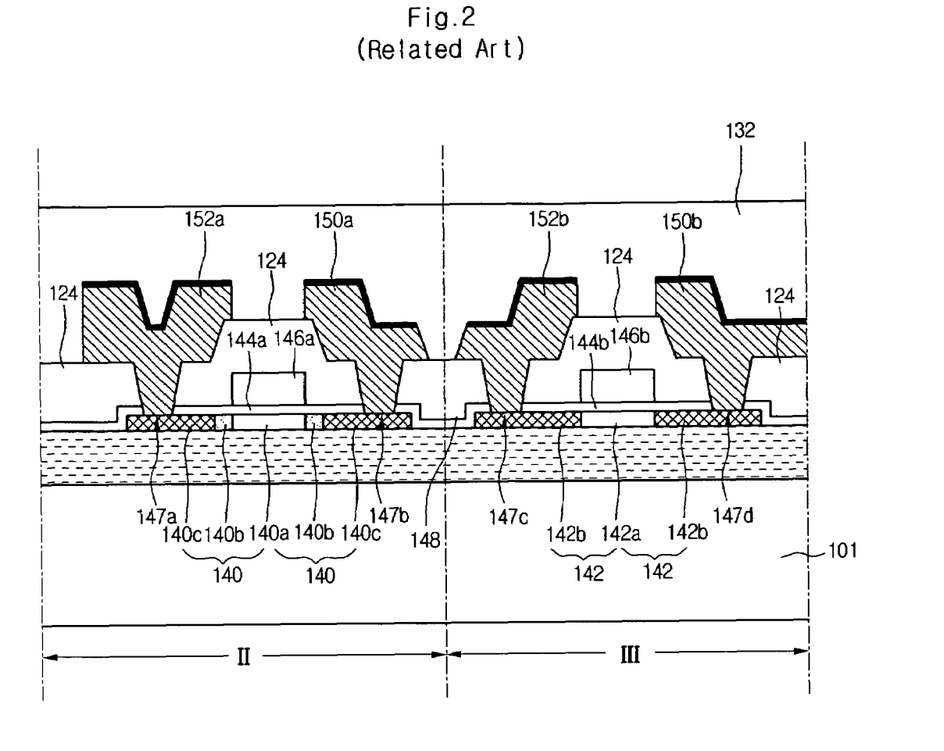
FIG. 2 is a sectional view of a CMOS TFT of a driving circuit unit in the related art LCD.

A structure of a TFT of a related art LCD will now be described in detail with reference to FIGS. 1 and 2. FIG. 1 is a sectional view of a TFT of a pixel unit in the related art LCD, and FIG. 2 is a sectional view of a CMOS TFT of a driving circuit unit in the related art LCD. Each of the pixel unit and the driving circuit unit includes a top gate type TFT having a gate electrode disposed on a semiconductor layer.

Referring to FIG. 1, in a TFT unit I of the pixel region, a buffer layer 114 is formed on an insulating layer 101, a semiconductor layer 116 is formed on the buffer layer 114, and a gate insulating layer 118 and a gate electrode 120 are sequentially stacked on the semiconductor layer 116. An interlayer insulating layer 124 including first and second semiconductor contact holes 122a and 122b is formed on the gate electrode 120. The interlayer insulating layer 124 is connected to the semiconductor layer 116 through the first and second semiconductor contact holes 122a and 122b. Source and drain electrodes 126 and 128 are formed an overlapping portion with the gate electrode 120 such that they are spaced apart from each other by a predetermined distance.

A passivation layer 132 including a drain contact hole 130 is formed on the source and drain electrodes 126 and 128. A pixel electrode 134 is formed on the passivation layer 132 to be connected to the drain electrode 128 through the drain contact hole 130.

The semiconductor layer 116 includes an active layer 116a formed in a region corresponding to the center of the gate insulating layer 118, an $n^+$ impurity layer 116c formed in a region contacting with the source and drain electrodes 126 and 128, and a lightly doped drain (LDD) layer 116b formed in a junction region between the drain electrode 128 and the gate electrode 120 between the active layer 116a and the $n^+$ impurity region 116c.

The LDD layer 116b is provided for dispersing hot carriers. The LDD layer 116b is doped at a low concentration to prevent an increase in leakage current and current loss in an on state of the transistor.

Referring to FIG. 2, a CMOS TFT of the driving circuit unit includes a TFT unit II having a channel doped with n-type ions, and a TFT unit III having a channel doped with p-type ions. The same reference numerals are used to denote the same elements.

An n-type semiconductor layer 140 and a p-type semiconductor layer 142 are formed on a transparent substrate 101 of a buffer layer 114 such that they are spaced apart from each other by a predetermined distance. Gate insulating layers 144a and 144b and gate electrodes 146a and 146b are formed on the n-type semiconductor layer 140 and the p-type semiconductor layer 142, respectively. An interlayer insulating layer 124 including semiconductor layer contact holes 147a, 147b, 147c and 147d is formed on the gate electrodes 146a and 146b over the entire surface of the substrate 101.

Source electrodes 150a and 152a and drain electrodes 150b and 152b are formed on the interlayer insulating layer 124 such that they are respectively connected to the n-type semiconductor layer 140 and the p-type semiconductor layer 142 through the semiconductor layer contact holes 147a, 147b, 147c and 147d. A passivation layer 132 is formed on the source and drain electrodes 150a, 152a, 150b and 152b over the entire surface of the substrate 101.

Like the semiconductor layer 116 in FIG. 1, the n-type semiconductor layer 140 includes an active layer 140a formed in a region corresponding to the center of the gate insulating layer 144a, an n-type impurity layer 140c formed in a region contacting with the source and drain electrodes 150a and 152a, and an LDD layer 140b formed in a region therebetween.

Since the p-type semiconductor layer 142 is formed by a method using carriers charged with positive charge and thus is less affected by a leakage current and degradation of carriers than the n-type TFT unit II, it is not provided with a separate LDD layer. Accordingly, the p-type semiconductor layer 142 includes an active layer 142a formed in a region corresponding to the center of the gate insulating layer 144b, and a p-type impurity layer 142b formed in a region contacting with the source and drain electrodes 150b and 152b.

A method of manufacturing the related art LCD uses nine mask processes. Each mask process includes a photolithographic process that requires a large amount of time and high cost. Accordingly, research is being actively conducted to reduce the number of the mask processes. When the number of the mask processes is reduced, the manufacturing process for the LCD can be simplified to reduce the manufacturing time and cost.

SUMMARY

By way of example, in one embodiment, a liquid crystal display device (LCD) comprises: an active layer and an active pattern on a substrate; a first capacitor electrode on the active pattern; a first insulating layer on the substrate including the first capacitor electrode; a gate electrode on the first insulating layer corresponding to the active layer; a second capacitor electrode on the first insulating layer corresponding to the active pattern; a second insulating layer on the substrate including the gate electrode; first and second transparent electrode patterns penetrating the first and second insulating layers and connected to the active layer; a pixel region connected to the second transparent electrode pattern; and source and drain electrodes on the first and second transparent electrode patterns.

In another embodiment, a method of manufacturing a LCD comprises: forming a semiconductor layer and a first conductive material on a substrate and using a first diffraction mask to form an active layer containing the semiconductor layer and a stack of an active pattern and a first capacitor electrode containing the semiconductor layer and the first conductive material; forming a first insulating layer on the substrate; forming a second conductive material on the substrate and patterning the resulting structure to form a gate electrode and a second capacitor electrode; ion implanting the active layer to form a doped active layer; forming a second insulating layer and a photoresist on the doped active layer; forming first and second contact holes that penetrate the first and second insulating layers to expose the active layer; forming a third conductive material on the photoresist with the first and second contact holes to form first and second connection electrodes on the exposed active layer; forming a transparent conductive electrode material and a fourth conductive material on the second insulating layer; and using a second diffraction mask to form a pixel electrode and a stack of first and second transparent electrode patterns and source and drain electrodes.

In another embodiment, a method of manufacturing an LCD comprises: forming a semiconductor layer and a first conductive material on a substrate and using a first diffraction mask to form an active layer containing the semiconductor layer and a stack of an active pattern and a first capacitor electrode containing the semiconductor layer and first conductive material; forming a first insulating layer on the substrate; forming a second conductive material and a first photoresist on the substrate and patterning the resulting structure to form a photoresist pattern, and using the photoresist pattern as an etching mask to form a gate electrode and a second capacitor electrode containing the second conductive material; doping, using the photoresist pattern as a mask, the active layer with a high concentration of ions to form source and drain regions; etching a portion of the photoresist pattern and etching the gate electrode using the etched photoresist pattern as an etch mask; doping, using the etched photoresist pattern as a mask, the active layer with a low concentration of ions to form a lightly doped drain (LDD) region; forming a second insulating layer and a photoresist on the doped active layer; forming first and second contact holes that penetrates the first and second insulating layers to expose the active layer; forming a third conductive material on the photoresist with the first and second contact holes to form first and second connection electrodes on the exposed active layer; and forming a transparent conductive electrode material and a fourth conductive material on the second insulating layer and using a second diffraction mask to form a pixel electrode and a stack of first and second transparent electrode patterns and source and drain electrodes.

In another embodiment, a method of manufacturing TFTs of different types in an LCD comprises at most six mask processes. The method includes: a first mask process in which gate electrode is patterned, a second mask process in which a first photoresist is patterned on the gate electrode and multiple ion implantations are performed using at least one of the first photoresist or the gate electrode to mask different areas of a semiconductor, a third mask process in which contact holes are formed in a second photoresist and an insulator to expose source and drain regions of the semiconductor, a process in which a conductive material is formed on the second photoresist and the conductive material is then lifted off, thereby leaving the conductive material on the source and drain regions exposed by the contact holes, and a fourth mask process in which a transparent conductive material is patterned to contact the remaining conductive material on the source and drain regions and to form a pixel electrode, the conductive material having a lower resistivity than the transparent conductive material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 3:
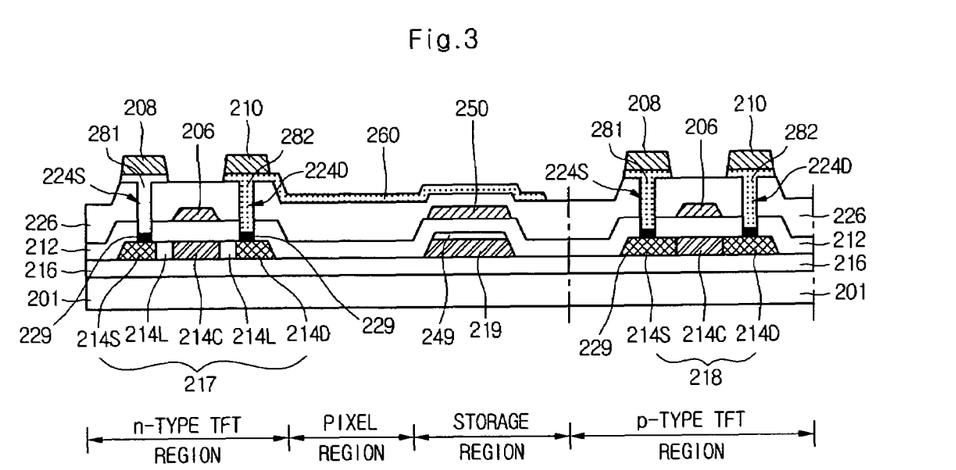
FIG. 3 is a sectional view illustrating regions of an array substrate for a polysilicon LCD according to a first embodiment of the present invention.

FIG. 3 is a sectional view illustrating regions of an array substrate for a polysilicon LCD according to a first embodiment of the present invention. The regions include an n-type TFT region, a pixel region, a storage region, and a p-type TFT region.

Referring to FIG. 3, a buffer layer 216 is formed on the entire surface of an insulating substrate 201, and an n-type TFT, a storage capacitor, and a p-type TFT are formed on the buffer layer 216. That is, the n-type TFT, the storage capacitor, and the p-type TFT are formed in the n-type TFT region, the storage region, and the p-type TFT region, respectively.

Each of the TFTs includes a gate electrode 206, active layers 217 and 218, and source and drain electrodes 208 and 210. The active layers 217 and 218 and an active pattern 219 are formed on the buffer layer 216, and a first capacitor electrode 249 is stacked on the active pattern 219. The active layers 217 and 218 are formed in the n-type TFT region and the p-type TFT region, respectively.

A gate insulating layer 212 is formed on the active layers 217 and 218, and a gate electrode 206 is formed on the gate insulating layer 212 corresponding to the active layers 217 and 218. Also, a second capacitor electrode 250 is formed on the gate insulating layer 212 corresponding to the active pattern 219 and the first capacitor electrode 249. The second capacitor electrode 250 is formed of the same material as the gate electrode 206.

An interlayer insulating layer 226 is formed on the gate electrode 206. Source and drain contact holes 224S and 224D are formed on the interlayer insulating layer 226 and the gate insulating layer 212 with the gate electrode 206 interposed between the holes 224S and 224D. That is, using the gate electrode 206, portions of the interlayer insulating layer 226 and the gate insulating layer 212 are removed to form the source and drain contact holes 224S and 224D.

The pixel region is disposed near each of the TFTs. A pixel electrode 260 and transparent electrode patterns 281 and 282 are formed on the interlayer insulating layer 226. The pixel electrode 260 is formed in the pixel region, and the transparent electrode patterns 281 and 282 are formed in the source and drain contact holes 224S and 224D, respectively. The pixel electrode 260 is formed of the same material as the transparent electrode patterns 281 and 282. The pixel electrode 260 is extended to overlap the first and second capacitor electrodes 249 and 250. The source and drain electrodes 208 and 210 are formed on the transparent electrode patterns 281 and 282, respectively.

Meanwhile, in the n-type TFT region, the active layer 217 includes a channel region 214C overlapping the gate electrode 206, a source region 214S doped with n$^+$ ions and electrically connected to the source electrode 208 and the transparent electrode pattern 281, a drain region 214D doped with n$^+$ ions and electrically connected to the drain electrode 210 and the transparent electrode pattern 282, a LDD region 214L formed between the channel region 214C and the drain region 214D and between channel region 214C and the source region 214S. The n$^+$ ions may be, for example, arsenic (As) or phosphorus (P) impurities. The LDD region 214L disperses hot carriers and is doped at a lower concentration than the drain region 214D or the source region 214S to prevent an increase in leakage current and current loss in an on state of the TFT.

In the p-type TFT regions, the active layer 218 includes a channel region 214C overlapping the gate electrode 206, a source region 214S doped with p$^+$ ions and electrically connected to the source electrode 208 and the transparent electrode pattern 281, and a drain region 214D doped with p$^+$ ions and electrically connected to the drain electrode 210 and the transparent electrode pattern 282. The p$^+$ ions may be, for example, boron (B) impurities.

Positive charges flow through the active layer 218. Thus, compared to the active layer 217, the active layer 218 is not affected to a great extent by carrier degradation and does not have a large leakage current. Accordingly, the active layer 218 may or may not use a separate LDD region.

A connection metal 229 for lowering a contact resistance with source and drain transparent electrode patterns 281 and 282 is formed on an active layer 214 exposed by the source and drain contact holes 224S and 224D. The connection metal 229 may be deposited to a thickness of about 100 Å or less using a metal such as molybdenum (Mo).

Figure 4A:
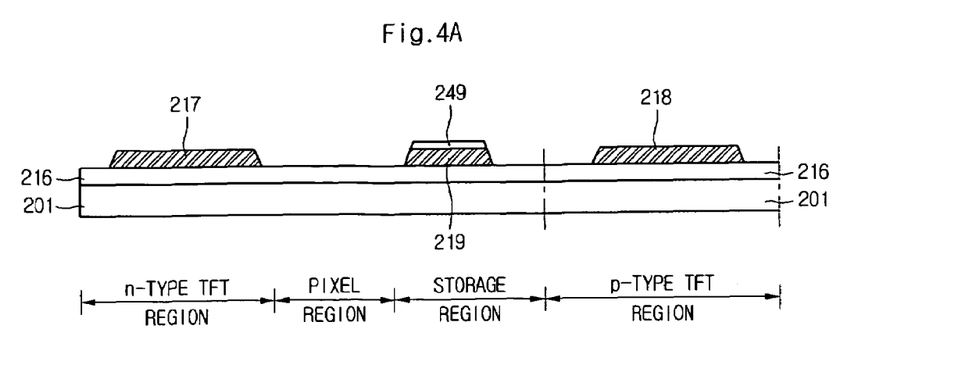
FIGS. 4A through 4I are sectional views illustrating a method of manufacturing an array substrate for a polysilicon LCD illustrated in FIG. 3.
Figure 4B:
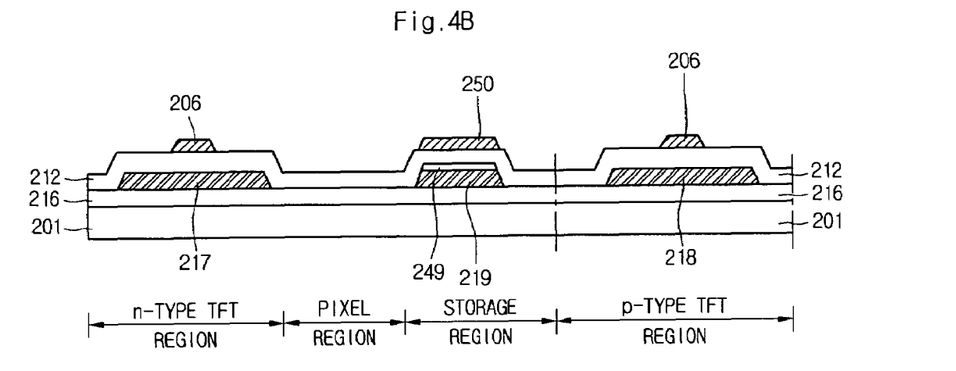
Figure 4C:
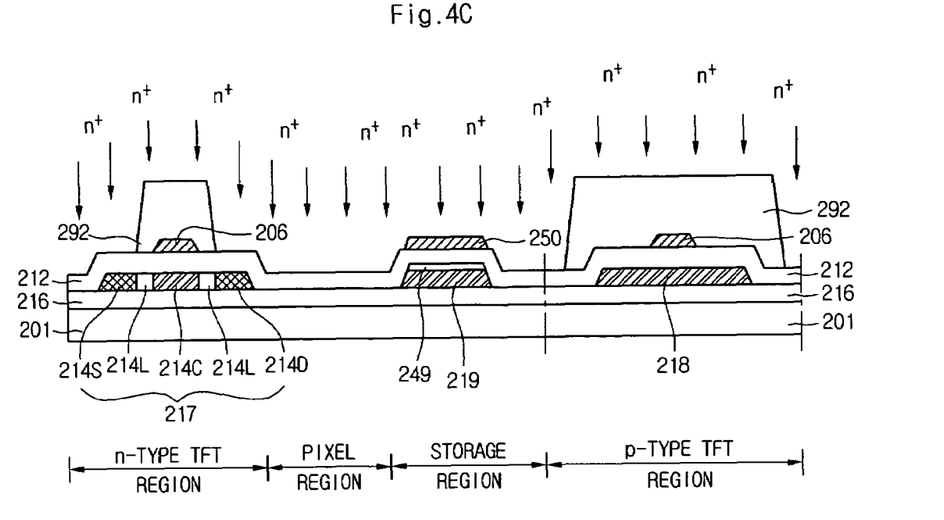
Figure 4D:
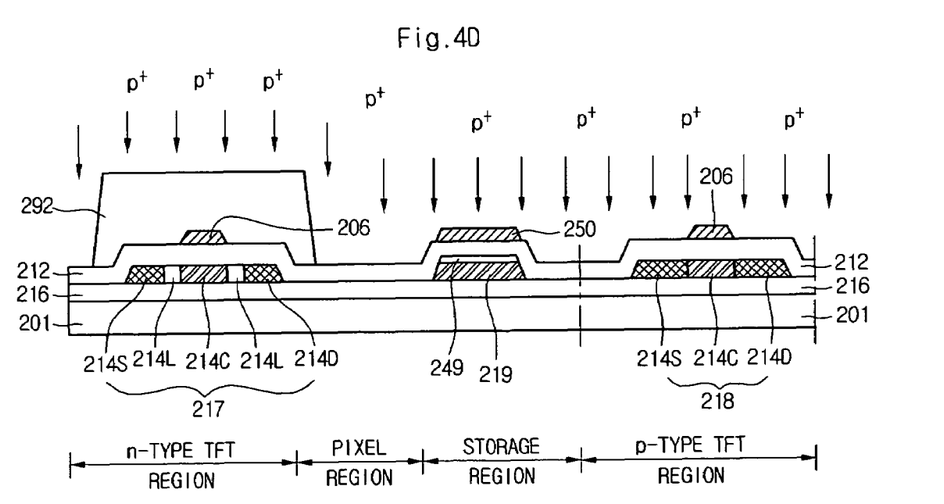
Figure 4E:
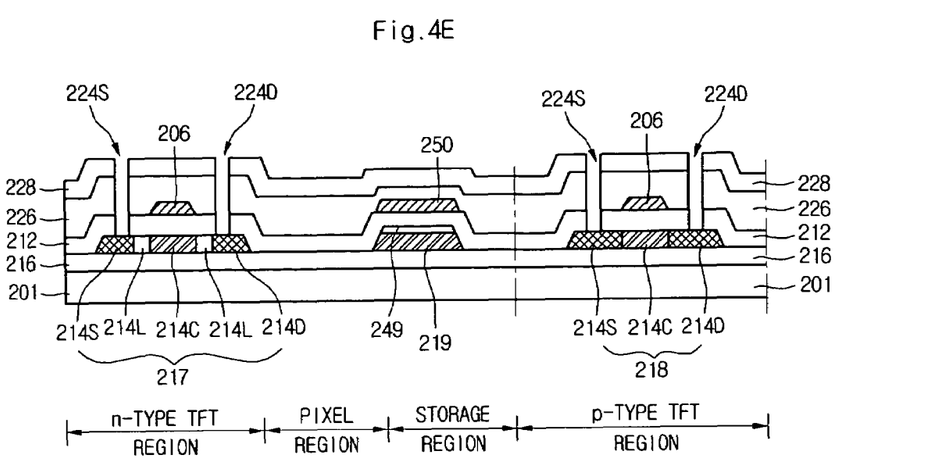
Figure 4F:
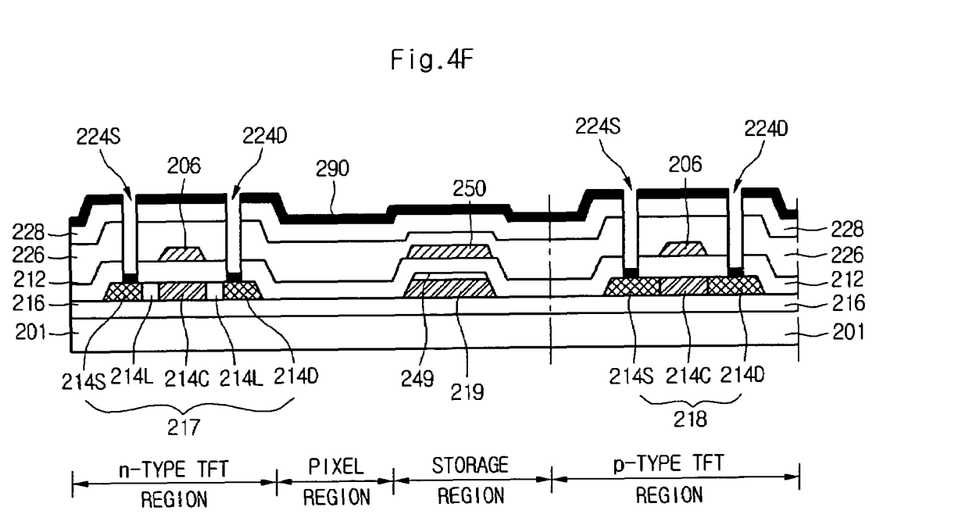
Figure 4G:
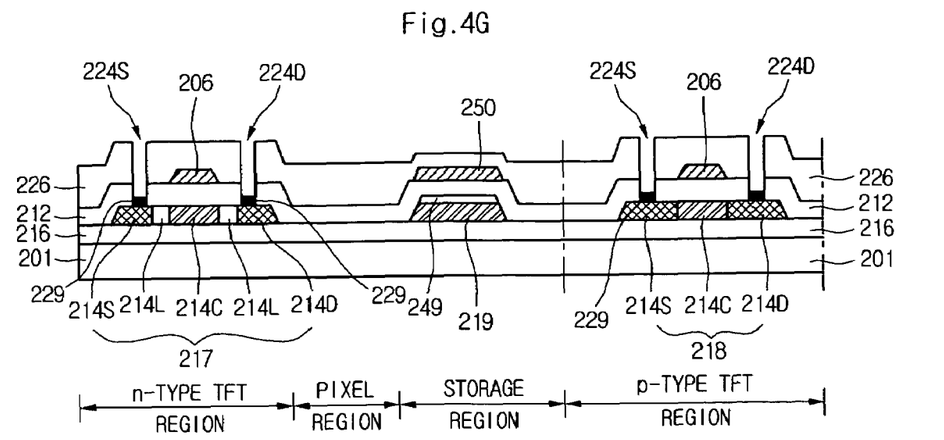
Figure 4H:
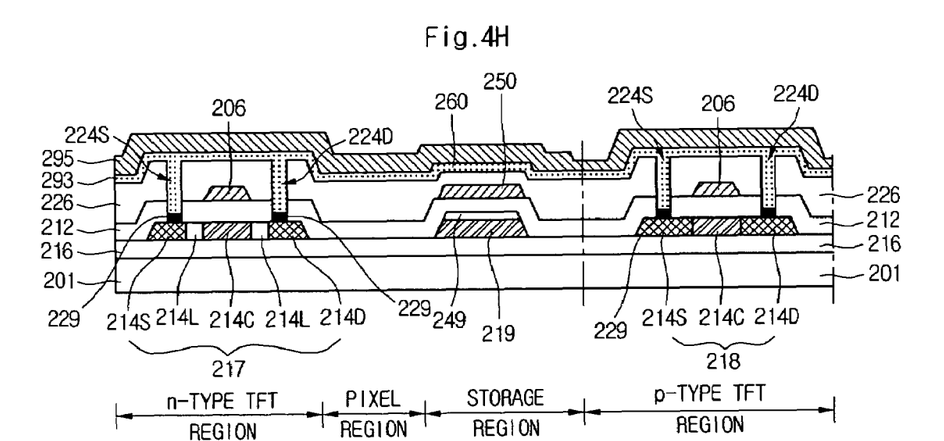
Figure 4I:
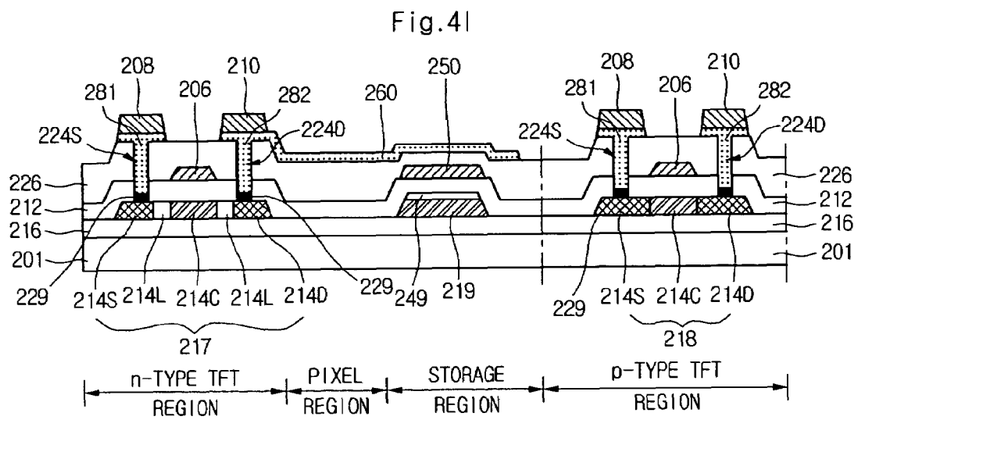

FIGS. 4A through 4I are sectional views illustrating a method of manufacturing the polysilicon LCD array substrate illustrated in FIG. 3. FIGS. 4A and 4I illustrate regions of the polysilicon LCD array substrate. These regions include an n-type TFT region, a pixel region, a storage region, and a p-type TFT region.

Referring to FIG. 4A, a buffer layer 216 is formed on an insulating substrate 201. The buffer layer 216 may be formed of an inorganic insulating material such as silicon nitride (SiN$_x$) and/or silicon oxide (SiO$_x$). Active layers 217 and 218 and an active pattern 219 are formed in a predetermined region of the buffer layer 216. A first capacitor electrode 249 is stacked on the active pattern 219.

In more detail, amorphous silicon (a-Si) is deposited on the entire surface of the substrate 201 including the buffer layer 216 by a technique such as plasma enhanced chemical vapor deposition (PECVD) or sputtering. Thereafter, in order to prevent the efficiency degradation of a subsequent crystallization process due to hydrogen mixed into the a-Si, the a-Si is dehydrogenated at about 400° C. The hydrogen mixed into the a-Si is removed by the above dehydrogenation process. The dehydrogenated a-Si is crystallized by a laser into polysilicon (also referred to as polycrystalline silicon).

Thereafter, a metal is deposited on the polysilicon, a photoresist is coated so as to pattern the dual-structure of the polysilicon and the metal, and a first capacitor electrode 249 is formed by a diffraction exposure process using a first diffraction mask. The use of the diffraction exposure process eliminates use of a separate mask for removing only the metal.

The first diffraction mask includes a full exposure portion that fully transmits light, a partial exposure portion that is formed in a lattice configuration to transmit only a portion of light by diffraction, and a full block portion that fully blocks light. The first diffraction mask is aligned on the substrate 201 such that the full block portion faces a region where the first capacitor electrode 249 is to be formed, the partial exposure portion faces a region where the active layers 217 and 218 are to be formed, and the full exposure portion faces the remaining region other than the regions where the first capacitor electrode 249 and the active layers 217 and 218 are to be formed. By this diffraction exposure process, the metal on the active layers 217 and 218 are removed and the metal on the active pattern 219 remains unremoved, thereby forming the first capacitor electrode 249. Note that use of a negative photoresist is described throughout. If a positive photoresist is used instead, the positions of the full exposure portion and the full block portion are exchanged.

Referring to FIG. 4B, a gate insulating layer 212 is formed on the substrate 201 including the active layers 217 and 218. The gate insulating layer 212 may be formed of an inorganic material such as SiO$_2$.

A gate electrode 206 is formed on the gate insulating layer 212 corresponding to a center region of the active layers 217 and 218, and a second capacitor electrode 250 is formed on the gate insulating layer 212 corresponding to the first capacitor electrode 249. Accordingly, since the first and second capacitor electrodes 249 and 250 are formed with the gate insulating layer 212 interposed therebetween, a storage capacitor is formed by the first capacitor electrode 249, the gate insulating layer 212 and the second capacitor electrode 250. The gate electrode 206 and the second capacitor electrode 250 may be formed of aluminum (Al), copper (Cu), molybdenum (Mo), titanium (Ti), chrome (Cr), tantalum (Ta), an Al alloy, a Cu alloy, a Mo alloy, and/or a tungsten-based metal.

Referring to FIG. 4C, a photoresist is formed on the entire surface of the gate electrode 206. The photoresist is patterned as a photoresist pattern 292 by photolithography. The photoresist pattern 292 blocks the p-type TFT region. The active layer 217 is doped with impurity ions in the n-type TFT region by low and high concentration impurity implantation processes using the photoresist pattern 292 as a mask.

In more detail, the photoresist pattern 292 is formed in the p-type TFT region and a peripheral region of the gate electrode 206. Using the photoresist pattern 292 as a mask, the active layer 217 is doped with $n^+$ ions and $n^-$ ions to form source and drain region 214S and 214D and an LDD region 214L on the active layer 217. The source and drain regions 214S and 214D are formed by a high-concentration ion implantation process, and the LDD region 214L is formed by a low-concentration ion implantation process. The $n^+$ ions and the $n^-$ ions may be arsenic (As) or phosphorus (P) ions, for example. The LDD region 214L disperses hot carriers. The LDD layer 116b has a low dopant concentration to prevent an increase in leakage current and current loss in an on state of the TFT.

Referring to FIG. 4D, after the photoresist pattern 292 is removed, the n-type TFT region is covered by the photoresist pattern 292. Using the photoresist pattern 292 as a mask, the p-type TFT region is doped with $p^+$ ions to form source and drain regions 214S and 214D. The $p^+$ ions may be boron ions, for example.

Consequently, an active layer 218 doped with $p^+$ ions is formed in the p-type TFT region. Thereafter, the photoresist pattern 292 is removed. As described above, the gate driving circuit unit and the data driving circuit unit each include a plurality of p-type driving TFTs and n-type TFTs connected in a CMOS structure.

Referring to FIG. 4E, an interlayer insulating layer 226 and a photoresist 228 are substantially sequentially formed on the gate electrode 206. Source and drain contact holes 224S and 224D are formed to penetrate the photoresist 228, the interlayer insulating layer 226, and the gate insulating layer 212, thereby exposing the source and drain regions 214S and 214D of the active layers 217 and 218.

Referring to FIG. 4F, a thin metal 290 is deposited on the photoresist 228. The metal 290 may be molybdenum (Mo), for example, and deposited to a thickness of about 100 Å or less. The metal 290 is deposited on the source and drain regions 214S and 214D of the active layers 217 and 218 through the source and drain contact holes 224S and 224D and thus formed as a connection metal 229 for lowering the contact resistance.

Referring to FIG. 4G, the photoresist 228 is removed to lift off the metal deposited on the photoresist 228. Accordingly, a connection metal 229 is formed on the source and drain regions 214S and 214D that are exposed by the source and drain contact holes 224S and 224D penetrating the interlayer insulating layer 226 and the gate insulating layer 212. The connection metal 229 is formed in the p-type TFT region as well as the n-type TFT region.

Referring to FIG. 4H, a transparent conductive electrode material 293 is formed on the interlayer insulating layer 226, and a metal 295 is formed on the transparent conductive electrode material 293. The transparent conductive electrode material 293 may be formed of indium-tin-oxide, indium-zinc-oxide, indium-tin-zinc-oxide, zinc-oxide, and indium-oxide. The metal 295 may be molybdenum (Mo), titanium (Ti), tantalum (Ta), a Mo alloy, and/or an Al alloy, for example.

Referring to FIG. 4I, using a second diffraction mask, the transparent conductive electrode material 293 and the metal 295 are diffractively exposed to form source and drain electrodes 208 and 210, source and drain transparent electrode patterns 281 and 282, and a pixel electrode 260. The pixel electrode 260 is formed with the drain transparent electrode pattern 282. The source and drain electrodes 208 and 210 are formed on the source and drain transparent electrode patterns 281 and 282. The pixel electrode 260 is formed on the pixel region.

In more detail, a photoresist is formed on the transparent conductive electrode material 293 and the metal 295. Thereafter, the transparent conductive electrode material 293 and the metal 295 is diffractively exposed by aligning the second diffraction mask including a full exposure portion that fully transmits light, a partial exposure portion that is formed in a lattice configuration and transmits only a portion of light by diffraction, and a full block portion that fully blocks light. The full block portion faces a region where the source and drain electrodes 208 and 210 are to be formed, and the partial exposure region faces a region where the pixel electrode 260 is to be formed. Accordingly, the source and drain electrodes 208 and 210 are spaced apart from each other by a predetermined distance, and the source and drain transparent electrode patterns 281 and 282 are formed below the source and drain electrodes 208 and 210. The pixel electrode 260 extends from the drain transparent electrode pattern 282 to the pixel region. The pixel electrode 260 may cover the second capacitor electrode 250.

Second Embodiment

Figure 5A:
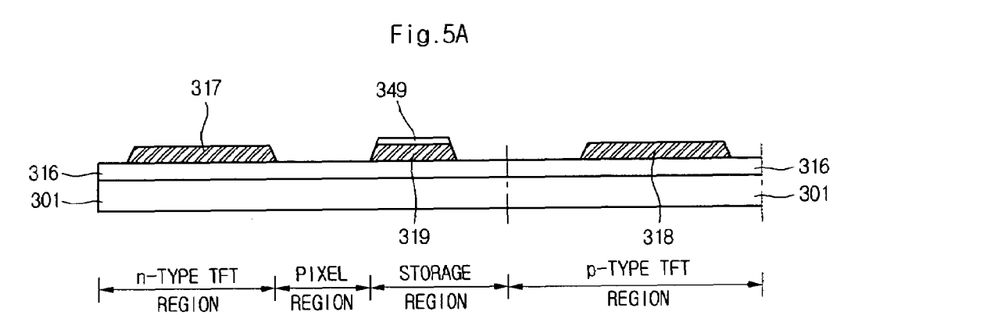
FIGS. 5A through 5K are sectional views illustrating a method of manufacturing an array substrate for a polysilicon LCD according to a second embodiment of the present invention.
Figure 5B:
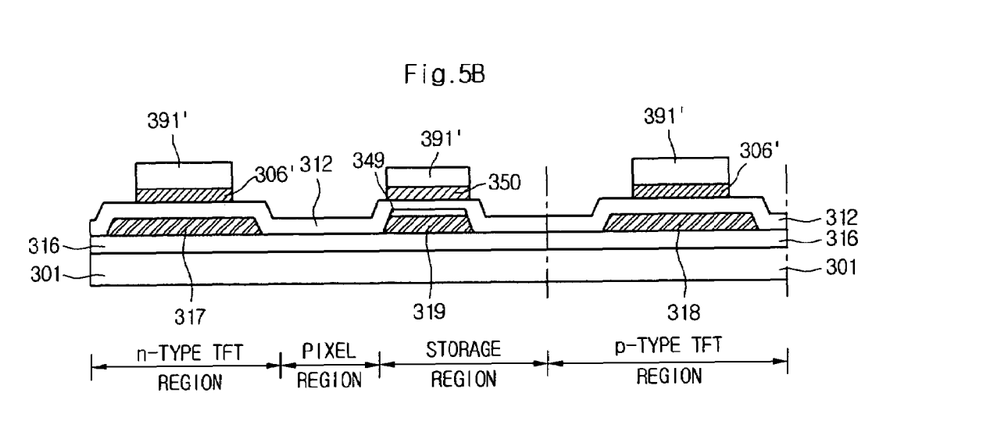
Figure 5C:
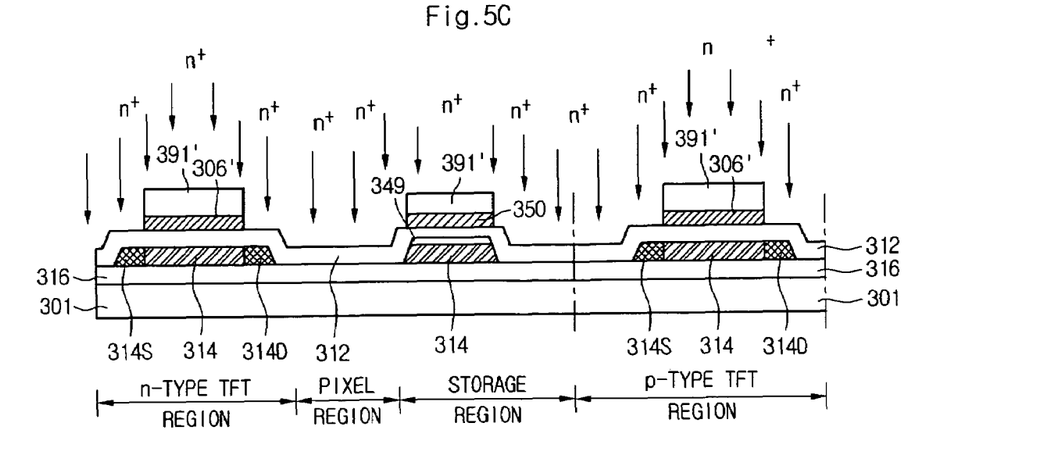
Figure 5D:
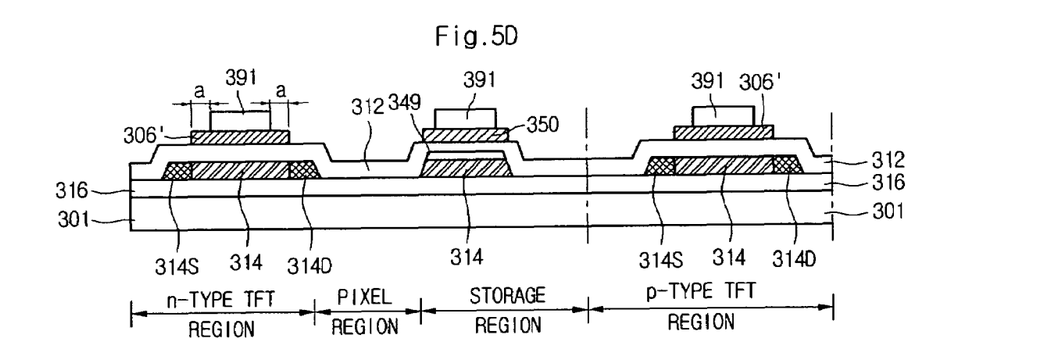
Figure 5E:
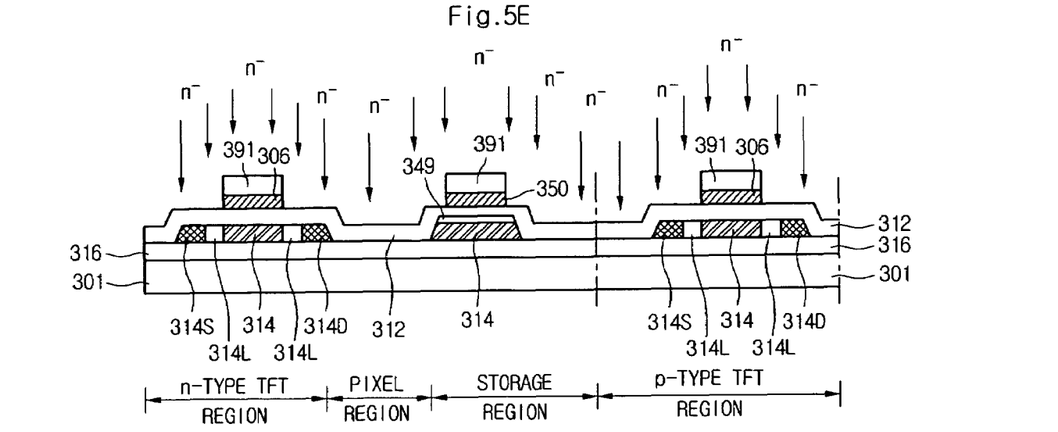
Figure 5F:
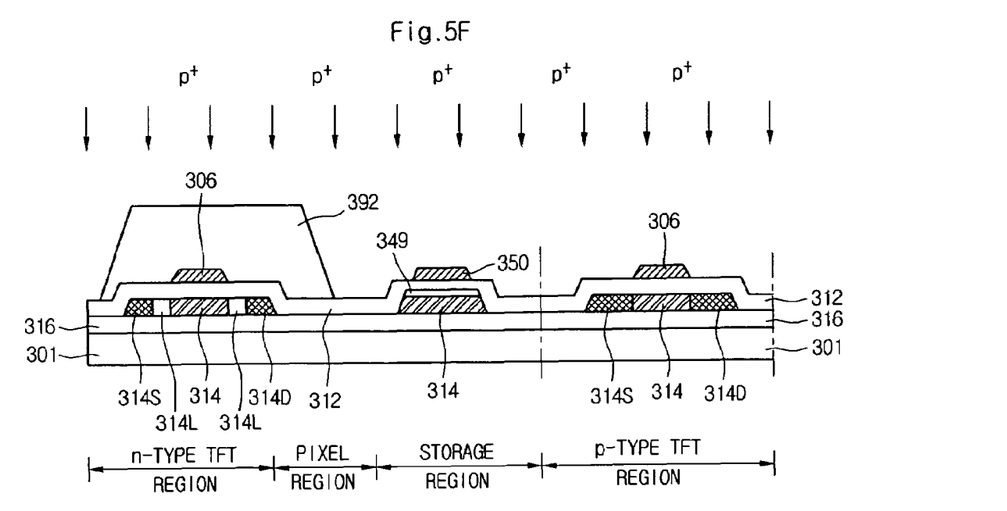
Figure 5G:
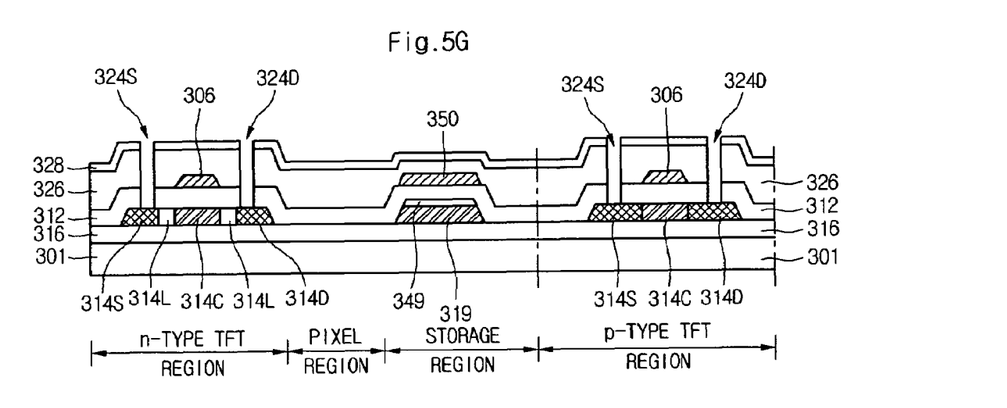
Figure 5H:
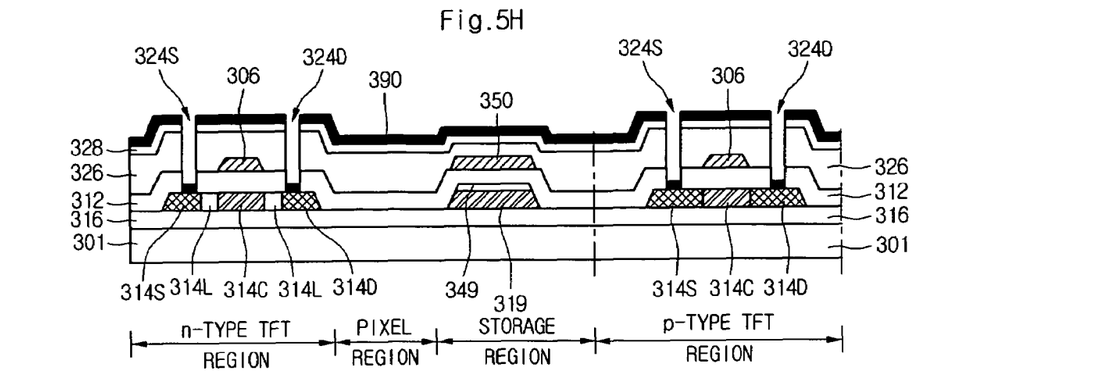
Figure 5I:
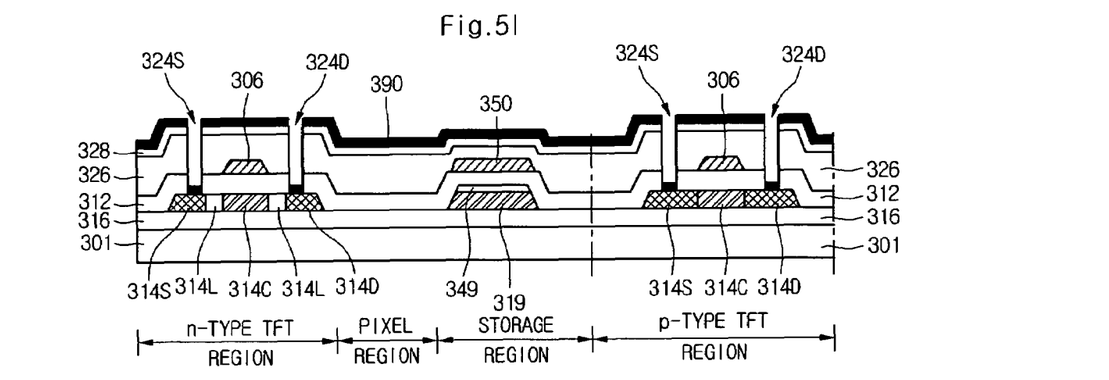
Figure 5J:
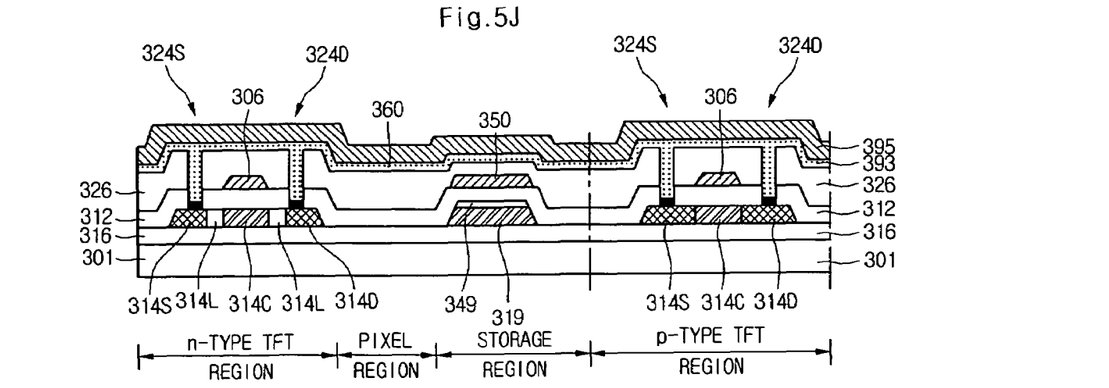
Figure 5K:
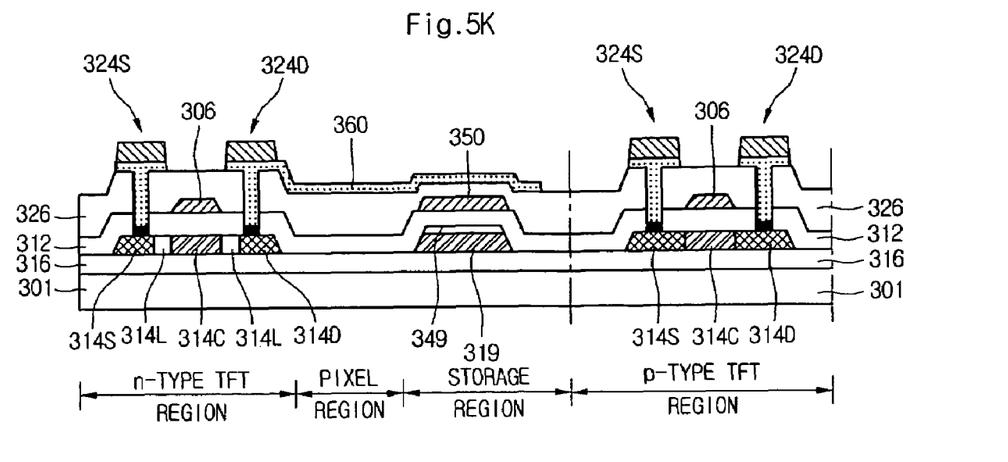

FIGS. 5A through 5K are sectional views illustrating a method of manufacturing an array substrate for a polysilicon LCD according to a second embodiment of the present invention. FIGS. 5A and 5K illustrate regions of the polysilicon LCD array substrate. The regions include an n-type TFT region, a pixel region, a storage region, and a p-type TFT region.

Referring to FIG. 5A, a buffer layer 316 is formed on an insulating substrate 301. The buffer layer 316 may be formed of an inorganic insulating material such as a silicon nitride ($SiN_x$) and/or a silicon oxide ($SiO_x$). Active layers 317 and 318 and an active pattern 319 are formed in a predetermined region of the buffer layer 316, and a first capacitor electrode 349 is stacked on the active pattern 319.

In more detail, amorphous silicon (a-Si) is deposited on the entire surface of the substrate 301 including the buffer layer 316 by a deposition process such as plasma enhanced chemical vapor deposition (PECVD) or sputtering. Thereafter, in order to prevent the efficiency degradation of a subsequent crystallization process due to hydrogen mixed into the a-Si, the a-Si is dehydrogenated at about 400° C. The hydrogen mixed into the a-Si is removed by the above dehydrogenation process. The dehydrogenated a-Si is crystallized by a laser into polysilicon.

Thereafter, a metal is deposited on the polysilicon, a photoresist is coated so as to pattern the dual-structure of the polysilicon and the metal, and a first capacitor electrode 349 is formed by a diffraction exposure process using a first diffraction mask. The use of the diffraction exposure process eliminates use of a separate mask for removing only the metal.

The first diffraction mask includes a full exposure portion that fully transmits light, a partial exposure portion that is formed in a lattice configuration to transmit only a portion of light by diffraction, and a full block portion that fully blocks light. The first diffraction mask is aligned on the substrate 301 such that the full block portion faces a region where the first capacitor electrode 349 is to be formed, the partial exposure portion faces a region where the active layers 317 and 318 are to be formed, and the full exposure portion faces the remaining region other than the regions where the first capacitor electrode 349 and the active layers 317 and 318 are to be formed. By this diffraction exposure process, the metal on the active layers 317 and 318 are removed and the metal on the active pattern 319 remains unremoved, thereby forming the first capacitor electrode 349.

Referring to FIG. 5B, a gate insulating layer 312 is formed on the substrate 301 including the active layers 317 and 318. The gate insulating layer 312 may be formed of an inorganic material such as $SiO_2$.

A gate electrode 306' is formed on the gate insulating layer 312 corresponding to a center region of the active layers 317 and 318, and a second capacitor electrode 350 is formed on the gate insulating layer 312 corresponding to the first capacitor electrode 349. Accordingly, since the first and second capacitor electrodes 349 and 350 are formed with the gate insulating layer 312 interposed therebetween, a storage capacitor is formed by the first capacitor electrode 349, the gate insulating layer 312 and the second capacitor electrode 350.

The gate electrode 306' and the second capacitor electrode 350 may be formed of aluminum (Al), copper (Cu), molybdenum (Mo), titanium (Ti), chrome (Cr), tantalum (Ta), an Al alloy, a Cu alloy, a Mo alloy, and/or a tungsten-based metal. Since the gate electrode 306' and the second capacitor electrode 350 are patterned by photolithography, a photoresist pattern 391' remains on the gate electrode 306' and the second capacitor electrode 350. The photoresist pattern 391' remains in the n-type TFT region, the storage region, and the p-type TFT region.

Referring to FIG. 5C, using the photoresist pattern 391' as a mask, $n^+$ impurity source and drain regions 314S and 314D are formed in the n-type TFT region by doping the region with $n^+$ ions.

Referring to FIG. 5D, each side portion of the photoresist pattern 391' is etched such that each side portion of the gate electrode 306' is exposed to a predetermined width "a". Accordingly, the etched photoresist pattern 391 is formed on the gate electrode 306'.

Referring to FIG. 5E, the gate electrode 306' is etched using the etched photoresist pattern 391 as an etch mask. The gate electrode 306' is then etched by a wet-etching process. Accordingly, each side portion of the gate electrode 306' is etched to the predetermined width "a" to form a desired gate electrode 306. Consequently, the etched gate electrode 306 is smaller in width than the gate electrode 306' by about "2a". The profile of the etched gate electrode 306 may be adjusted depending on the wet-etching process time, and the wet-etch process may be an isotropic wet-etching process. Alternatively, the gate electrode 306' may be etched by a dry-etching process.

Referring to FIG. 5E, using the etched photoresist pattern 391 as a mask, an LDD region 314L with an $n^-$ impurity region is formed in an active layer 314 corresponding to the etched width "a" of the gate electrode 306 by doping the $n^-$ ions. The $n^+$ ions and the $n^-$ ions may be arsenic or phosphorus ions, for example. The LDD region 314L has a low doping concentration so as to disperse hot carriers, thereby preventing an increase in leakage current and current loss in an on state of the TFT.

In the active layers 317 and 318, the region other the source and drain regions 314S and 314D and the LDD region, that is, the region facing the gate electrode 306, becomes a channel region 314C. Accordingly, the active layer 317 of the n-type TFT region includes the channel region 314C facing the gate electrode 306, the source and drain regions 314S and 314D formed at both sides of the channel region 314C, and the LDD-region 314L formed between the source region 314S and the channel region 314C and between the drain region 314D and the channel region 314C.

As described above, the gate electrode 306 on the substrate 301 is first etched to form the photoresist pattern 391. Using the photoresist pattern 391 as a mask, a high concentration of ions is used to form the source and drain regions 314S and 314D. Thereafter, the gate electrode 306 is second etched to form the etched gate electrode 306'. Using the etched gate electrode 306' as a mask, a low concentration of ions is used to form the LDD region 314L.

Accordingly, the source and drain regions 314S and 314D and the LDD region 314L may be formed by one mask process. Therefore, it is possible to reduce the number of masks and simplify the manufacturing process for the polysilicon LCD array substrate. Also, the second etching of the gate electrode 306 is performed by an isotropic etching process. Accordingly, the LDD region 314L has a uniform width, thereby making it possible to enhance the device characteristics.

Referring to FIG. 5F, after the photoresist pattern 39a is removed, the n-type TFT region is blocked by the photoresist pattern 392. Using the photoresist pattern 392 as a mask, the active layers 317 and 318 of the p-type TFT region are doped with $p^+$ ions to form source and drain regions 314S and 314D. The $p^+$ ions may be boron ions, for example. As described above, the gate driving circuit unit and the data driving circuit unit each include a plurality of p-type driving TFTs and n-type TFTs connected in a CMOS structure.

Referring to FIG. 5G, the photoresist pattern 392 is removed, and an interlayer insulating layer 326 and a photoresist 328 are sequentially formed on the gate electrode 306. Source and drain contact holes 324S and 324D are formed to penetrate the photoresist 328, the interlayer insulating layer 326, and the gate insulating layer 312 and expose the source and drain regions 314S and 314D of the active layers 317 and 318.

Referring to FIG. 5H, a thin metal 390 is deposited on the photoresist 328. The metal 390 may be molybdenum (Mo), for example, and deposited to a thickness of 100 Å or less. The metal 390 is deposited on the source and drain regions 314S and 314D of the active layers 317 and 318 through the source and drain contact holes 324S and 324d and thus formed as a connection metal 329 for lowering the contact resistance.

Referring to FIG. 5I, the photoresist 328 is removed to lift off the metal 392 deposited on the photoresist 328. Accordingly, a connection metal 329 is formed on the source and drain regions 314S and 314D that are exposed by the source and drain regions 324S and 324D penetrating the interlayer insulating layer 326 and the gate insulating layer 312. The connection metal 329 is formed in the p-type TFT region as well as the n-type TFT region.

Referring to FIG. 5J, a transparent conductive electrode material 393 is coated on the interlayer insulating layer 326, and a metal 395 is formed on the transparent conductive electrode material 393. The transparent conductive electrode material 393 may be indium-tin-oxide, indium-zinc-oxide, indium-tin-zinc-oxide, zinc-oxide, and/or indium-oxide, for example. The metal 395 may be molybdenum (Mo), titanium (Ti), tantalum (Ta), a Mo alloy, and/or an Al alloy, for example.

Referring to FIG. 5K, using a second diffraction mask, the transparent conductive electrode material 393 and the metal 395 are diffractively exposed to form source and drain electrodes 308 and 310, source and drain transparent electrode patterns 381 and 382, and a pixel electrode 360. The pixel electrode 360 is formed with the drain transparent electrode pattern 382. The source and drain electrodes 308 and 310 are formed on the source and drain transparent electrode patterns 381 and 382. The pixel electrode 360 is formed on the pixel region.

In more detail, a photoresist is formed on the transparent conductive electrode material 393 and the metal 395. Thereafter, the transparent conductive electrode material 393 and the metal 395 is diffractively exposed by aligning the second diffraction mask including a full exposure portion that fully transmits light, a partial exposure portion that is formed in a lattice configuration transmits only a portion of light by diffraction, and a full block portion that fully blocks light.

The full block portion faces a region where the source and drain electrodes 308 and 310 are to be formed, and the partial exposure region faces a region where the pixel electrode 360 is to be formed. Accordingly, the source and drain electrodes 308 and 310 are spaced apart from each other by a predetermined distance, and the source and drain transparent electrode patterns 381 and 382 are formed below the source and drain electrodes 308 and 310.

The pixel electrode 360 extends from the drain transparent electrode pattern 382 to the pixel region. The pixel electrode 360 may cover the second capacitor electrode 350.

As described above, the active layer and the storage electrode are simultaneously formed by diffraction exposure, and the source and drain electrodes and the pixel electrode are simultaneously formed by diffraction exposure. Accordingly, the number of masks is reduced to simplify the manufacturing process, enhance the manufacturing yield and reduce the manufacturing costs.

The first and second connection electrodes for lowering the contact resistance between the drain electrode and the active layer are formed by the lift-off process, thereby simplifying the manufacturing process. The high-concentration ions are doped using the photoresist pattern formed on the firstly-etched gate electrode as a mask. Next, a portion of the photoresist pattern is etched and the gate electrode is secondly etched using the etched photoresist pattern as a mask. Thereafter, the low-concentration ions are doped using the secondly-etched gate electrode as a mask. Therefore, the source and drain regions and the LDD region may be simultaneously formed, thereby making it possible to reduce the number of required masks and simplify the manufacturing process. Also, the second etching of the gate electrode is performed by an isotropic etching process. Accordingly, the LDD region is formed in a uniform width, thereby making it possible to enhance the device characteristics.

It will be apparent to those skilled in the art that various modifications and variations can be made in the present invention. For example, although the use of metals has been described herein, any desired conductive material may be used. Thus, it is intended that the present invention covers the modifications and variations of this invention provided they come within the scope of the appended claims and their equivalents.

What is claimed is:

1. A method of manufacturing a liquid crystal display device (LCD), the method comprising:
    forming a semiconductor layer and a first conductive material on a substrate and using a first diffraction mask to form an active layer containing the semiconductor layer and a stack of an active pattern and a first capacitor electrode containing the semiconductor layer and the first conductive material;
    forming a first insulating layer on the substrate;
    forming a second conductive material on the substrate and patterning the resulting structure to form a gate electrode and a second capacitor electrode;
    ion implanting the active layer to form a doped active layer;
    forming a second insulating layer and a photoresist on the doped active layer;
    forming first and second contact holes that penetrate the first and second insulating layers to expose the active layer;
    forming a third conductive material on the photoresist with the first and second contact holes to form first and second connection electrodes on the exposed active layer;
    forming a transparent conductive electrode material and a fourth conductive material on the second insulating layer; and
    using a second diffraction mask to form a pixel electrode and a stack of first and second transparent electrode patterns and source and drain electrodes.

2. The method according to claim 1, wherein the first diffraction mask includes a full exposure portion, a partial exposure portion, and a full block portion, the stack of the active pattern and the first capacitor electrode is formed using the full block portion, and the active layer is formed using the partial exposure portion.

3. The method according to claim 1, wherein the second diffraction mask includes a full exposure portion, a partial exposure portion, and a full block portion, the stack of the first and second transparent electrode patterns and the source and drain electrodes is formed using the full block portion, and the pixel electrode is formed using the partial exposure portion.

4. The method according to claim 1, wherein the second capacitor electrode is formed to correspond to the first capacitor electrode with the first insulating layer interposed therebetween.

5. The method according to claim 1, wherein the pixel electrode covers the second capacitor electrode.

6. The method according to claim 1, wherein forming the semiconductor layer comprises depositing amorphous silicon and crystallizing the amorphous silicon to form polysilicon.

7. The method according to claim 1, further comprising lifting off the photoresist to remove the third conductive material formed on the photoresist.

8. The method according to claim 1, wherein ion implanting the active layer comprises:
    providing a second photoresist on the substrate containing the gate electrode before ion implanting the active region;
    patterning the second photoresist to cover a larger area of the active layer than the gate electrode;

implanting source and drain regions of the active layer with a high concentration of dopants using the second photoresist as a mask;

removing the second photoresist; and implanting LDD regions of the active layer with a low concentration of dopants using the gate electrode as a mask.

9. The method according to claim 1, further comprising forming n-type and p-type TFTs using substantially the same set of processes.

10. The method according to claim 9, wherein the n-type and p-type TFTs are formed in gate and data driving circuit units and a liquid crystal display region of the LCD.

11. The method according to claim 9, wherein the n-type and p-type TFTs are formed in a maximum of six mask processes.

* * * * *